United States Patent [19]

Thomas

[11] Patent Number: 5,600,235
[45] Date of Patent: Feb. 4, 1997

[54] BIPOLAR CASCADABLE CIRCUIT CONFIGURATION FOR SIGNAL LIMITATION AND FIELD INTENSITY DETECTION

[75] Inventor: Volker Thomas, München, Germany

[73] Assignee: Siemens Aktiengesellschaft, Munich, Germany

[21] Appl. No.: 512,467

[22] Filed: Aug. 8, 1995

[30] Foreign Application Priority Data

Aug. 8, 1994 [DE] Germany .......................... 44 27 974.4

[51] Int. Cl.[6] .................................................. G05F 3/16
[52] U.S. Cl. .......................................... 323/315; 323/316
[58] Field of Search ..................................... 323/315, 316

[56] References Cited

U.S. PATENT DOCUMENTS 4,381,497  4/1983  Lillis et al. .
4,882,761  11/1989  Waldhauer .............................. 381/106
5,377,156  12/1994  Watanabe et al. ....................... 365/227
5,463,309  10/1995  Kawano .................................. 323/315
5,512,816  4/1996  Lambert ................................. 323/315
5,526,313  6/1996  Etoh et al. ............................. 365/205

*Primary Examiner*—Stuart N. Hecker
*Attorney, Agent, or Firm*—Herbert L. Lerner; Laurence A. Greenberg

[57] ABSTRACT

A bipolar cascadable circuit configuration includes a limiter stage generating an output signal. A detection stage receives the output signal from the limiter stage and supplies an output signal. A power supply receives a supply voltage and feeds an output current to the detection stage. The power supply and the output signal of the detection stage are dependent on the supply voltage. A configuration for compensating for fluctuations in the power supply forms a difference between a first, early-dependent current and a second, less early-dependent current, multiplies it by a factor and adds it to the output current of the power supply.

5 Claims, 3 Drawing Sheets

BIPOLAR CASCADABLE CIRCUIT CONFIGURATION FOR SIGNAL LIMITATION AND FIELD INTENSITY DETECTION

BACKGROUND OF THE INVENTION

Field of the Invention

The invention relates to a bipolar cascadable circuit configuration for signal limitation and field intensity detection, having a limiter stage which generates an output signal that is supplied to a detection stage, and a power supply feeding current to the detection stage, wherein the power supply and therefore an output signal of the detection stage are dependent on a supply voltage.

One such circuit configuration is described, for instance, in the paper by J. Fenk, B. Birth, R. G. Irvine, P. Sehrig and K. R. Schön, entitled "An RF-Front End For Digital Mobile Radio", in IEEE 1990, Bipolar Circuits and Technology Meeting 11.2. Such circuits are cascadable, in that case with seven stages, producing a reception circuit of the kind often needed not only in radio and television technology but also in the mobile radio field. To that end, the limiter amplifier stages are connected in series with one another, while the field intensity detector stages, each assigned to the various limiter amplifier stages, are connected in parallel on the output side.

In wireless equipment, a long battery life is generally sought. Moreover, the batteries should be low in weight and small in size, to assure a compact construction of the equipment. In order to achieve that, on one hand it requires reducing the power consumption, and/or on the other hand minimizing the number of individual battery cells, which demands a lower minimum supply voltage of the receiving circuit. The resultant disadvantage is that the circuit configuration is dependent on fluctuations of the supply voltage.

SUMMARY OF THE INVENTION

It is accordingly an object of the invention to provide a bipolar cascadable circuit configuration for signal limitation and field intensity detection, which overcomes the hereinafore-mentioned disadvantages of the heretofore-known devices of this general type in such a way that reduced dependency on fluctuations in the supply voltage is assured.

With the foregoing and other objects in view there is provided, in accordance with the invention, a bipolar cascadable circuit configuration, comprising a limiter stage generating an output signal; a detection stage receiving the output signal from the limiter stage and supplying an output signal; a power supply receiving a supply voltage and feeding an output current to the detection stage; the power supply and the output signal of the detection stage being dependent on the supply voltage; and a configuration for compensating for fluctuations in the power supply and forming a difference between a first, early-dependent current and a second, less early-dependent current, multiplying the difference by a factor and adding the multiplied difference to the output current of the power supply.

Advantageously, the factor can be adjusted in such a way that the linear supply voltage dependency term is compensated for precisely, or the supply-voltage-dependent fluctuation width is minimized.

In accordance with another feature of the invention, there is provided a terminal for the supply voltage; a current mirror having an input circuit and an output circuit; first and second coupled current sources for forming the first early-dependent current and the second, less early-dependent current, the current sources having an input side connected to the supply voltage terminal and an output side connected to both the input circuit and the output circuit of the current mirror; the output circuit of the current mirror and the output of the second current source forming a node point; and a current amplifier stage having an input connected to the node point and an output furnishing a compensation current.

In accordance with a further feature of the invention, there are provided first and second current sources supplying output currents; at least one current mirror; the output current of the first current source being out-coupled through the at least one current mirror and subtracted from the output current of the second current source to obtain a current; and at least one further current source through which the current thus obtained is out-coupled and added to the output current of the power supply.

In accordance with an added feature of the invention, there is provided a further current mirror receiving the output current of the current amplifier stage and having an output at which the compensated current can be picked up.

In accordance with a concomitant feature of the invention, the current mirror has a transistor being a base of a current bank for supplying a plurality of cascaded limiter/detection stages.

Other features which are considered as characteristic for the invention are set forth in the appended claims.

Although the invention is illustrated and described herein as embodied in a bipolar cascadable circuit configuration for signal limitation and field intensity detection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
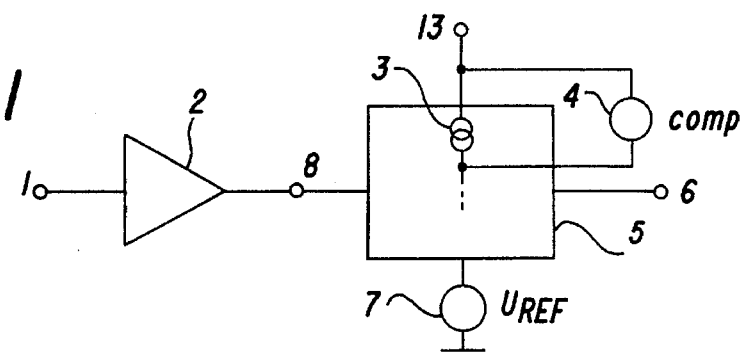
FIG. 1 is a basic schematic circuit diagram of a configuration according to the invention.

Referring now to the figures of the drawings in detail, and first, particularly, to FIG. 1 thereof, it is seen that reference numeral 1 indicates an input terminal to which an HF signal is supplied, and reference numeral 2 indicates a limiter stage having an output 8 at which a limited signal can be picked up. This terminal 8 is connected to an input of a detector stage 5, which is fed through a supply voltage terminal 13 and a current source 3 connected to the supply voltage terminal. An output signal of the detector stage can be picked up at a terminal 6. The detector stage 5 is also supplied with a reference voltage from a reference voltage source 7. Finally, a configuration 4 for generating a compensation current $I_{COMP}$ is connected between the supply voltage terminal 13 and an output of the current source 3.

Figure 2:
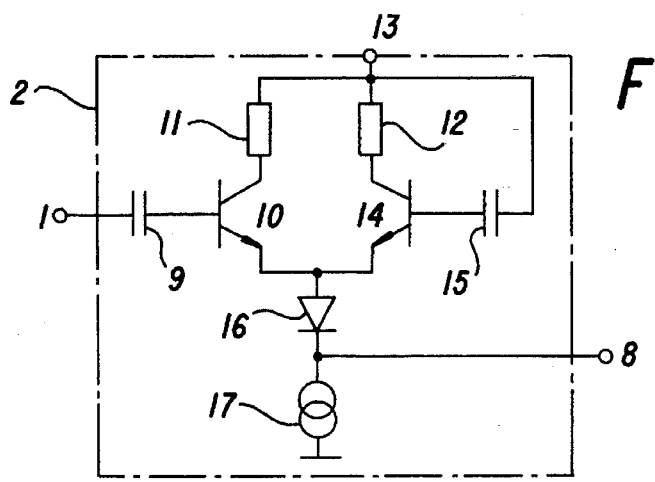
FIG. 2 is a circuit diagram of an exemplary embodiment of a cascadable limiter stage.

The limiter stage 2 in FIG. 1 will now be described in further detail in conjunction with FIG. 2. In the exemplary embodiment shown in this case, the limiter amplifier stage includes two npn transistors 10, 14, having coupled emitters which are connected to a ground potential through a diode 16 and a current source 17. Collectors of the two transistors 10, 14 are each connected through a respective resistor 11, 12 acting as a load, to the supply potential terminal 13.

Bases of the transistors 10 and 14 are each proceeded by a respective capacitor 9 and 15. These may, for instance, be formed by npn transistors, having collectors and emitters which are connected to one another. The bases of the transistors 10 and 14 can then be triggered by a differential input signal, through the capacitors 9 and 15. However, in the example shown the stage is connected with an asymmetrical signal, and as a result a first input terminal at the capacitor 9 is connected to an input terminal 1, and a second input terminal at the capacitor 15 is connected to the supply voltage. A pickup that is connected to the output terminal 8 is provided between the diode 16 and the current source 17. By dimensioning the current source 17 and the resistors 11 and 12, the limiter is constructed in such a way that beyond a certain intensity of the input signal at the terminal 1, the output signal at the output terminal 8 essentially no longer rises.

Figure 3:
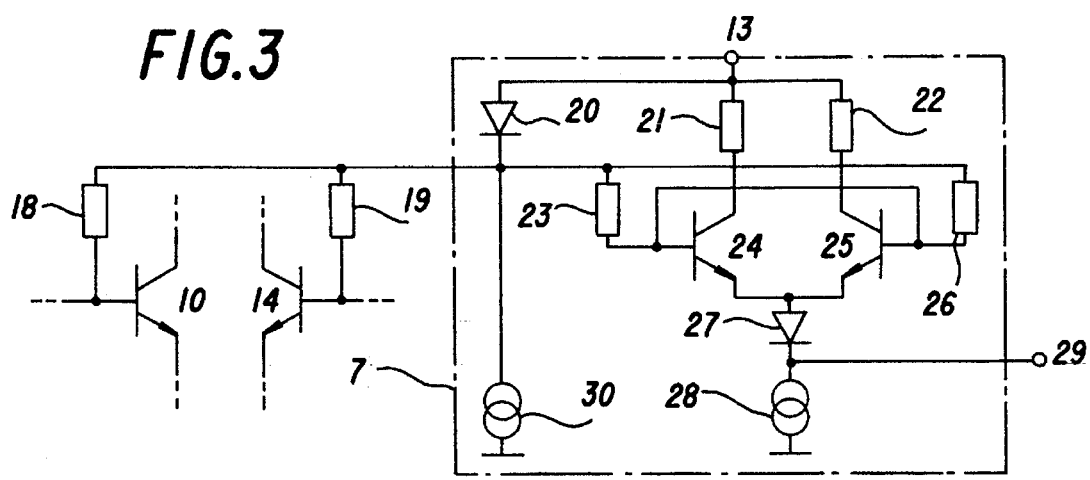
FIG. 3 is a circuit diagram of an exemplary embodiment of a reference voltage source.

FIG. 3 shows a reference voltage source for generating a resistor voltage for the detector stage 5. To that end, the configuration has a pickup for the input signal of the limiter stage at the bases of the transistors 10 and 14. The bases of the transistors 10 and 14 are each connected to a first terminal of a respective one of first and second resistors 18 and 19. Second terminals of each of the resistors are connected to one another and lead to respective first terminals of third and fourth resistor 23 and 26. The resistor 23 is connected both to a base terminal of an npn transistor 24 and a base terminal of an npn transistor 25, as well as to a second terminal of the resistor 26. Emitters of the npn transistors 24 and 25 are likewise connected to one another and are connected to the ground potential through a diode 27 and a current source 28. Collectors of the transistors 24 and 25 are each connected through a respective resistor 21 and 22 to the supply potential terminal 13. A diode 20 which is also provided is connected in the current flow direction between the supply voltage terminal 13 and the first terminals of each of the resistors 23 and 26. Finally, a further current source 30 is provided between the first terminals of each of the resistors 23 and 26 on one hand, and ground potential on the other hand. A pickup which is provided between the diode 27 and the current source 28 is connected to an output terminal 29 at which the reference voltage can be picked up.

Figure 4:
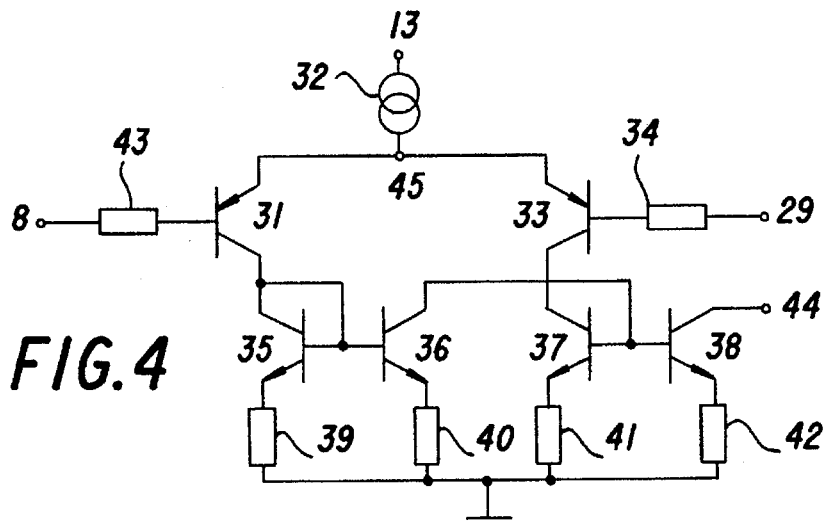
FIG. 4 is a circuit diagram of an exemplary embodiment of a detector stage.

FIG. 4 shows the field intensity detector stage, which has two transistors that are of the conduction type which is opposite that of the transistors 10 and 14 of the limiter amplifier stage 2, namely pnp transistors 31 and 33. Emitters of the transistors 31 and 33 are coupled to one another and are connected through a current source 32 to the supply potential terminal 13. A base of the transistor 31 is connected through a resistor 43 and the input terminal 8 to the coupled emitters of the transistors 10 and 14. A base of the transistor 33 is connected through a resistor 34 to the output terminal 29 of the reference voltage source 7. Collectors of the transistors 31 and 33 are each applied through an input circuit of a respective current mirror to the ground potential. To that end, the collector of the transistor 31 is connected through an npn transistor 35, which is wired to make a diode in the conducting direction by connecting its base and collector, and through a resistor 39 that is connected into an emitter line of the transistor 35, to the ground potential. The base and the collector of the transistor 35 are connected to a base of an npn transistor 36, having an emitter which is likewise connected through a resistor 40 to the ground potential. Correspondingly, the collector of the transistor 33 is coupled through an npn transistor 37 that is operated as a diode in the conducting direction by connecting its base and collector, and through a resistor 41 connected into an emitter line of the transistor 37, to the ground potential. An npn transistor 38 has a base connected to a base and a collector of the transistor 37. An emitter of the npn transistor 38 is connected through a resistor 42 to the ground potential and a collector of the npn transistor 38 carries an output signal 44. An output circuit of the current mirror that has the transistors 35 and 36 and the resistors 39 and 40 is coupled with an input circuit of the current mirror that has the transistors 37 and 38 and the resistors 41 and 42. To that end, the collector of the transistor 36 is connected to the bases of the transistors 37 and 38.

In this kind of circuit configuration, the differential amplifiers in the field intensity detector stage and the limiter amplifier stage are constructed with transistors of opposite conduction types. As a result, the coupled emitters of the transistors 10 and 14 are applied to ground potential through the common current source 3, while the coupled emitters of the transistors 31 and 33 are connected to the supply potential terminal 13 through the common current source 32.

Consequently, the various loads are also connected to different potentials. Accordingly, the resistors 11 and 12 are connected between the collectors of the transistors 10 and 14 and the supply potential terminal 13, while the input circuits of the two current mirrors, respectively formed by the transistors 35 and 37 and the resistors 39 and 41, are connected between the collectors of the transistors 31 and 33 and the ground potential. The result for the circuit configuration is that the input signal of the field intensity detector stage, namely the difference between the potential at the base of the transistor 31 and ground potential, merely has to overcome a diode threshold that is predetermined by the transistor 35 which is connected as a diode.

In addition, the transistor 31 that is acted upon by the input signal is loaded only by the input circuit of a current mirror, which is approximately equivalent to a diode threshold, while the transistor 33 that is triggered with the reference potential 29 is loaded by both the output circuit of the first current mirror and the input circuit of the second current mirror, resulting in a higher voltage drop at that point. The output circuit of the second current mirror having the transistor 38 and the resistor 42 forms a current sink. In the cascading, these current sinks of a plurality of detector stages can be connected parallel to one another. Through the use of an additional current mirror on the output side, for instance, a current source mode can then be established in a simple way.

As can be seen from FIG. 4, a relatively strong dependency of the power supply on the supply voltage is effected in particular by the current source 32, which is connected directly to the supply voltage terminal 13. In FIG. 4, a node point of the emitters of the transistors 31 and 33 and of the current source 32 is indicated by reference numeral 45. According to the invention, this point 45 is now acted upon by the compensation current, in order to make the power supply of the detector stage independent of fluctuations in the supply voltage.

Figure 5:
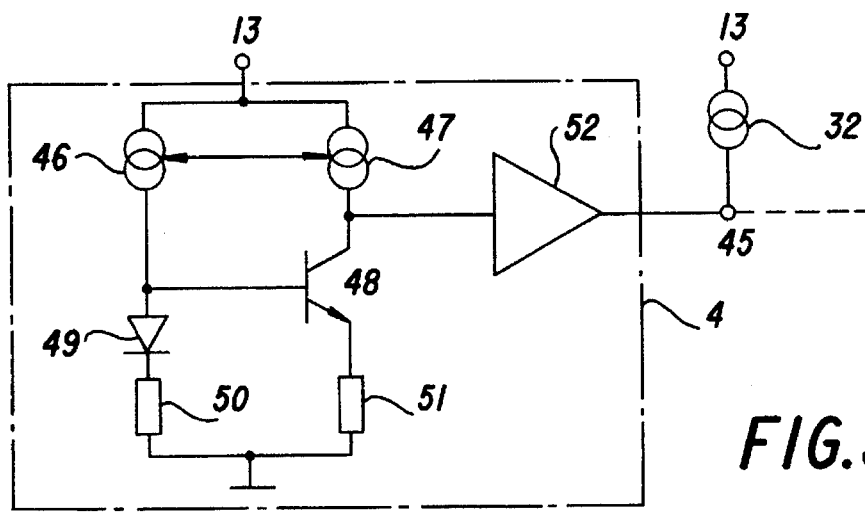
FIG. 5 is a circuit diagram of a first exemplary embodiment of a compensation stage.

To that end, FIG. 5 shows a first embodiment of a stage according to the invention for furnishing a compensation current. The stage or configuration 4 includes two coupled current sources 46 and 47, which are connected on the input side to the supply terminal 13. The coupling is indicated by an arrow. The current sources 46 and 47 are connected on the output side with a respective input circuit and output circuit of a current mirror. To that end, an output of the current source 46 is connected through a diode 49 and a series-connected resistor 50 to the ground potential. The output of the current source 46 is also connected to a base terminal of an npn transistor 48. An output terminal of the current source 47 is connected on one hand to a current amplifier 52, which is constructed as an I/I amplifier, and on the other hand to a collector of the npn transistor 48. An emitter of that transistor 48 is connected through a resistor 51 to the ground potential. At an output of the current amplifier 52, the compensation current is obtained, is supplied to the node point 45 and can be picked up with a selectable factor (compensation factor).

Figure 7:
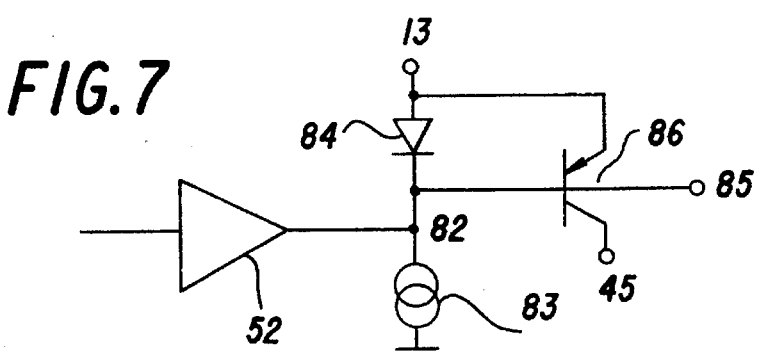
FIG. 7 is a circuit diagram of an exemplary embodiment of a current mirror.

Alternatively, the current amplifier 52 can also be followed by a configuration as in FIG. 7. In this case a current mirror is provided that includes a current source 83 and a series-connected diode 84 as well as a pnp transistor 86. The diode 84 is connected in the current flow direction and in series with the current source 83 between the supply voltage terminal 13 and ground. A node point 82 of the series circuit is connected on one hand to the output of the amplifier 52 and on the other hand to a base of the transistor 86, which in turn is connected to a terminal 85 and by way of example is coupled with a current bank for supplying a plurality of cascaded limiter/detector stages with identical current sources. A collector of the transistor 86 then forms the collector output 45, and an emitter of the transistor 86 is connected to the supply voltage terminal 13.

In detail, the effect of the problem of supply voltage dependency is that the output current at the terminal 44 of the detector stage rises as the supply voltage rises. The origin thereof is primarily the early voltage dependency of all of the collector currents of the transistors 31, 33, 35, 37, which has a direct effect on the output current at the terminal 44, and the early voltage dependency of the collector current of the current source 17, which has an effect on the amplification per cascaded limiter stage. As the amplification per stage increases, the steepness of the field intensity detector characteristic curve also increases, and as a result the voltage-dependent effect and therefore the inaccuracy of the outcome of measurement are reinforced. The compensation current $I_{COMP}$ is formed from the difference between a first early-dependent current of the current source 46 and a less early-dependent current of the current source 47, and is multiplied by a factor that is provided by the buffer stage or amplifier 52 in FIG. 5. The dimensioning is chosen in such a way that a linear dependency of the result at the terminal 44 is attained, and the dependency thus becomes independent of the supply voltage.

Theoretically, the two coupled current sources furnish currents of equal magnitude. However, because of their finite defined internal resistance and the differing load on the particular output circuit, different early dependencies are involved.

Figure 6:
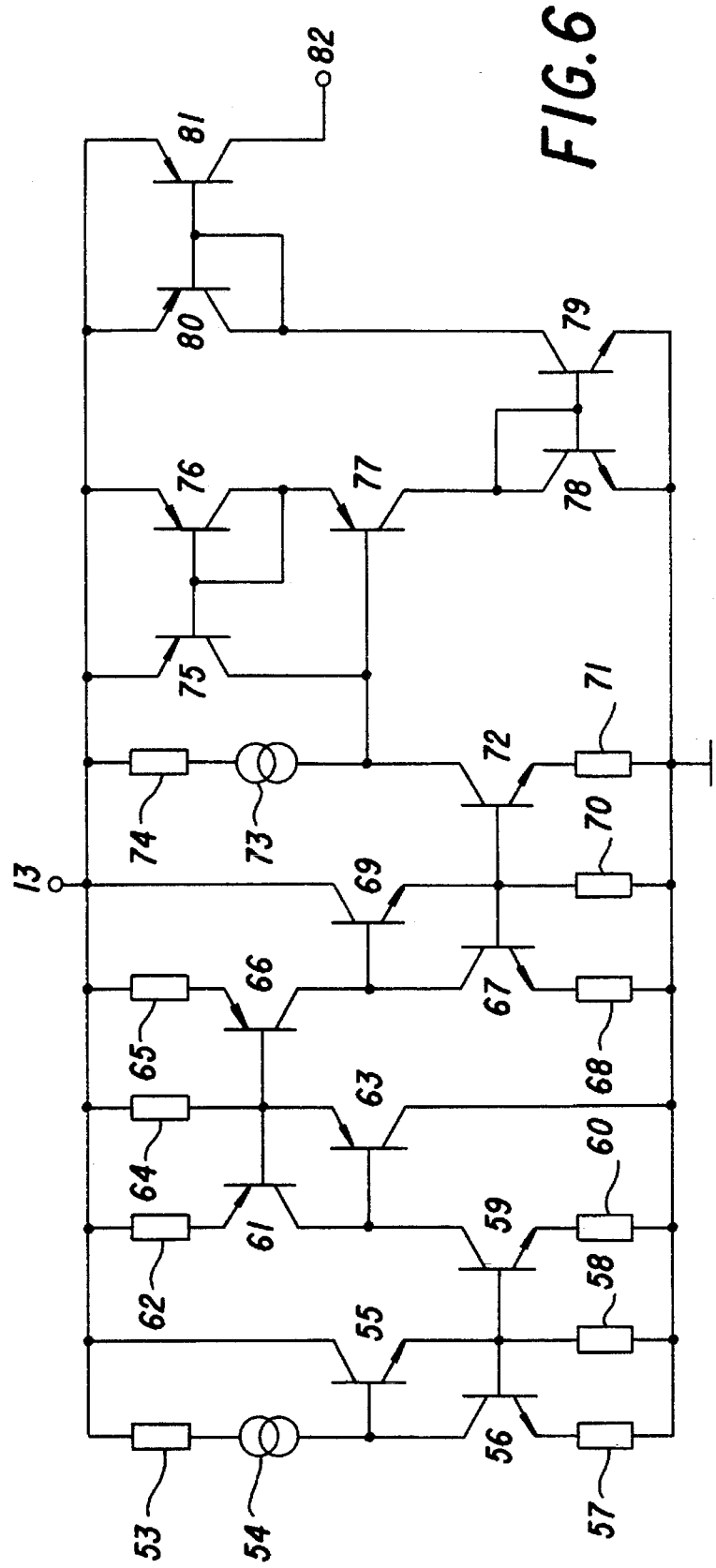
FIG. 6 is a circuit diagram of a second exemplary embodiment of a compensation stage.

In order to illustrate this, FIG. 6 shows a further, more-detailed exemplary embodiment of a configuration according to the invention for furnishing a compensation current. A first current source is indicated by reference numeral 54 and is connected on the input side through a resistor 53 to the supply voltage terminal 13. On the output side, the current source 54 is connected both to a base of an npn transistor 55 and to a collector of an npn transistor 56. An emitter of the transistor 56 is connected through a resistor 57 to the ground potential. An emitter of the transistor 55 is connected to a base terminal of the transistor 56, through a resistor 58 to the ground potential and to a base terminal of a further npn transistor 59. An emitter of the further npn transistor 59 in turn is likewise connected through a resistor 60 to the ground potential. A collector of the transistor 59 is connected both to a base terminal of a pnp transistor 63 and to a collector terminal of a pnp transistor 61. An emitter of the pnp transistor 61 is connected through a resistor 62 to the supply voltage terminal 13. A base terminal of the transistor 61 is connected not only with an emitter of the transistor 63 and with a base terminal of a further pnp transistor 66 but also, through a resistor 64, with the supply voltage terminal 13. An emitter of the transistor 66 is connected through a resistor 65 to the supply voltage terminal. A collector of the transistor 66 is connected both to a base terminal of an npn transistor 69 and to a collector terminal of an npn transistor 67. Emitters of the transistors 67 and 69 are each connected to the ground potential through a respective resistor 68 and 70. A base terminal of the transistor 67 is also connected to the emitter terminal of the transistor 69 and to a base terminal of a further npn transistor 72. An emitter of the transistor 72 is likewise connected through a resistor 71 to the ground potential. A collector of the npn transistor 72 is connected through a second current source 73 and a series-connected resistor 74 to the supply voltage terminal 13. The collector of the transistor 72 is also connected both to a collector of a further pnp transistor 75 and to a base terminal of a further pnp transistor 77. A base terminal of the transistor 75 is connected on one hand to a base terminal of a pnp transistor 76, which is connected as a diode and has a collector that is connected to the base, and on the other hand to an emitter of the transistor 77. The emitters of the transistors 75 and 76 are connected to the supply voltage terminal. A collector of the transistor 77 is connected to a collector of an npn transistor 78, which is connected as a diode and has a collector and a base that are connected to one another. The base of the transistor 78 is connected to a base of an npn transistor 79. Emitters of the transistors 78 and 79 are connected to the ground potential. A collector of the transistor 79 is connected to a collector of a pnp transistor 80, which is connected as a diode and has a collector and a base which are coupled to one another. The base terminals of the transistor 80 and a further pnp transistor 81 are connected to one another, and emitter terminals of the transistors 80 and 81 are connected to the supply voltage terminal 13. A collector of the transistor 81 is connected to an output terminal 82, which can correspond to the node point 82 of FIG. 7.

As can be seen, the current of the current source 54 is subtracted from the current of the current source 73 through three current mirrors, which are respectively formed of the transistors 55, 56, 59; 61, 63, 66; and 67, 69, 72, along with the associated resistors. The current thus obtained is in turn out-coupled through three current mirrors 75–81, and the current mirror including the transistors 78 and 79 multiplies the compensation current by the aforementioned factor. The output transistor 79 may be dimensioned accordingly, through the use of a plurality of parallel-connected transistors of the same type.

The current mirror 75 . . . 81 serves to adjust the compensation factor, for instance also through the use of a plurality of parallel-connected transistors, or by the use of transistors with different emitter areas. The current mirror 75 . . . 77 is constructed in this case as a Wilson current mirror and has a current amplification factor 1 with β base current compensation, for mirroring a very low current with a low factor.

I claim:

1. A bipolar cascadable circuit configuration, comprising:

a limiter stage generating an output signal;

a detection stage receiving the output signal from said limiter stage and supplying an output signal;

a power supply receiving a supply voltage and feeding an output current to said detection stage;

said power supply and the output signal of said detection stage being dependent on the supply voltage; and a configuration for compensating for fluctuations in said power supply and forming a difference between a first, early-dependent current and a second, less early-dependent current, multiplying the difference by a factor and adding the multiplied difference to the output current of said power supply.

2. The circuit configuration according to claim 1, including a terminal for the supply voltage;

a current mirror having an input circuit and an output circuit; first and second coupled current sources for forming the first early-dependent current and the second, less early-dependent current, said current sources having an input side connected to said supply voltage terminal and an output side connected to both the input circuit and the output circuit of said current mirror;

the output circuit of said current mirror and the output of said second current source forming a node point; and a current amplifier stage having an input connected to said node point and an output furnishing a compensation current.

3. The circuit configuration according to claim 1, including:

first and second current sources supplying output currents;

at least one current mirror;

the output current of said first current source being out-coupled through said at least one current mirror and subtracted from the output current of said second current source to obtain a current; and at least one further current source through which the current thus obtained is out-coupled and added to the output current of said power supply.

4. The circuit configuration according to claim 2, including a further current mirror receiving the output current of said current amplifier stage and having an output at which the compensated current can be picked up.

5. The circuit configuration according to claim 4, wherein said current mirror has a transistor being a base of a current bank for supplying a plurality of cascaded limiter/detection stages.

* * * * *